(12) United States Patent
Yevtukhov et al.

(10) Patent No.: US 7,557,362 B2
(45) Date of Patent: Jul. 7, 2009

(54) ION SOURCES AND METHODS FOR GENERATING AN ION BEAM WITH A CONTROLLABLE ION CURRENT DENSITY DISTRIBUTION

(75) Inventors: Rustam Yevtukhov, Briarwood, NY (US); Alan V. Hayes, Great Neck, NY (US); Viktor Kanarov, Bellmore, NY (US); Boris L. Druz, Brooklyn, NY (US)

(73) Assignee: Veeco Instruments Inc., Woodbury, NY (US)

( * ) Notice: Subject to any disclaimer, the term of this patent is extended or adjusted under 35 U.S.C. 154(b) by 332 days.

(21) Appl. No.: 11/678,979

(22) Filed: Feb. 26, 2007

(65) Prior Publication Data
US 2007/0194245 A1 Aug. 23, 2007

Related U.S. Application Data

(63) Continuation-in-part of application No. 10/772,132, filed on Feb. 4, 2004, now Pat. No. 7,183,716.

(51) Int. Cl.
  *H01J 49/10* (2006.01)
  *H01J 1/50* (2006.01)
  *H01J 37/08* (2006.01)
(52) U.S. Cl. ............ 250/423 R; 250/424; 250/396 ML; 315/111.21; 315/111.81; 315/111.01; 118/723 I
(58) Field of Classification Search ............. 250/423 R, 250/424, 396 ML; 315/111.21, 111.81, 111.01; 118/723 I
See application file for complete search history.

(56) References Cited

U.S. PATENT DOCUMENTS

| | | | |
|---|---|---|---|
| 1,624,071 A | 4/1927 | Kneeland | |
| 2,103,623 A | 12/1937 | Hermann | |
| 2,257,411 A | 9/1941 | Bernhard | |
| 2,305,758 A | 12/1942 | Berghaus et al. | |
| 2,346,483 A | 4/1944 | Goss | |
| 2,463,180 A | 3/1949 | Johnson | |
| 2,843,542 A | 7/1958 | Callahan | |
| 3,100,272 A | 8/1963 | Wehner | |
| 3,233,137 A | 2/1966 | Anderson | |
| 3,329,601 A | 7/1967 | Mattox | |
| 3,394,066 A | 7/1968 | Miles | |
| 3,458,426 A | 7/1969 | Calderon | |
| 3,619,402 A | 11/1971 | Block et al. | |

(Continued)

FOREIGN PATENT DOCUMENTS

| | | |
|---|---|---|
| DE | 4325041 B4 | 2/1994 |
| EP | 0045858 A2 | 2/1982 |
| FR | 2779317 A1 | 12/1999 |
| JP | 04147969 A | 5/1992 |
| JP | 3071814 B2 | 7/2000 |
| WO | 9222920 A1 | 12/1992 |

OTHER PUBLICATIONS

European Patent Office, International Search Report issued in corresponding PCT Application serial number PCT/US2008/055016 dated Dec. 9, 2008.
European Patent Office, Partial International Search Report issued in corresponding PCT Application serial No. PCT/US2008/055016 dated Jul. 31, 2008.

*Primary Examiner*—Nikita Wells
(74) *Attorney, Agent, or Firm*—Wood, Herron & Evans LLP

(57) ABSTRACT

Ion sources and methods for generating an ion beam with a controllable ion current density distribution. The ion source includes a discharge chamber and an electromagnet adapted to generate a magnetic field for changing a density distribution of the plasma inside the discharge chamber and, thereby, to change the ion current density distribution.

34 Claims, 6 Drawing Sheets

U.S. PATENT DOCUMENTS

| | | |
|---|---|---|
| 3,875,028 A | 4/1975 | Atlee et al. |
| 4,116,793 A | 9/1978 | Penfold |
| 4,118,973 A | 10/1978 | Tucker et al. |
| 4,132,612 A | 1/1979 | Penfold |
| 4,132,613 A | 1/1979 | Penfold |
| 4,342,901 A | 8/1982 | Zajac |
| 4,578,559 A | 3/1986 | Hijikata et al. |
| 4,624,767 A | 11/1986 | Obinata |
| 4,632,719 A | 12/1986 | Chow |
| 4,641,031 A | 2/1987 | Ito et al. |
| 4,844,775 A | 7/1989 | Keeble |
| 4,946,576 A | 8/1990 | Dietrich |
| 4,963,242 A | 10/1990 | Sato |
| 5,009,738 A | 4/1991 | Gruenwald et al. |
| 5,021,919 A | 6/1991 | Engemann |
| 5,036,252 A | 7/1991 | Lob |
| 5,391,281 A | 2/1995 | Hieronymi et al. |
| 5,527,394 A | 6/1996 | Heinrich |
| 5,556,521 A | 9/1996 | Ghanbari |
| 5,997,686 A | 12/1999 | Lardon et al. |
| 6,664,547 B2 | 12/2003 | Benveniste |
| 7,183,716 B2 * | 2/2007 | Kanarov et al. ......... 315/111.51 |
| 7,303,982 B2 * | 12/2007 | Collins et al. ............... 438/514 |
| 2008/0179284 A1 * | 7/2008 | Hayes et al. .................. 216/61 |

* cited by examiner

ION SOURCES AND METHODS FOR GENERATING AN ION BEAM WITH A CONTROLLABLE ION CURRENT DENSITY DISTRIBUTION

CROSS-REFERENCE TO RELATED APPLICATIONS

The present application is a continuation-in-part of U.S. application Ser. No. 10/772,132, filed Feb. 4, 2004, the disclosure of which is hereby incorporated herein by reference in its entirety.

FIELD OF THE INVENTION

The invention relates to ion sources for generating a beam of energetic ions and methods of operating such ion sources.

BACKGROUND OF THE INVENTION

Ion beam processing systems are used in a variety of applications for modifying the properties of a substrate during the fabrication of thin film devices, such as semiconductor and data storage devices. In particular, etching steps may be used to remove and shape layers of material on a substrate. A conventional etching procedure involves the use of a working gas ionized into a plasma state at low pressures (i.e., pressures less than about 1 mTorr) from which ions are extracted and accelerated by ion optics for ion beam etching (IBE) of wafer materials As device critical dimensions shrink, the need for improved process uniformity without sacrificing beam directionality has driven the search for improved ion sources. IBE uniformity is directly related to the beam current density distribution of ions and energetic neutrals arising from charged ions converted to neutrals in charge exchange ion-atom collisions during the beam transport. The integrated beam particle flux density should be independent of the impact position on the substrate. The angular distribution of the charged and neutral beam particles at the substrate is directly related to the angular properties of the trajectories of the ions extracted from the plasma by the optics of the source. To optimize process uniformity, the incident angle of the particles across the substrate should be approximately parallel.

Conventional ion sources commonly utilize a helical or coil antenna that is wrapped about a discharge vessel to generate an inductively coupled plasma (ICP) using high frequency energy, such as radio-frequency (RF) energy. The antenna of the ion source, when carrying an oscillating high frequency current, induces a time-varying magnetic field inside the discharge vessel. In accordance with Faraday's law, the time-varying magnetic field induces a solenoidal high frequency electric field, which accelerates the electrons in an azimuthal direction in the discharge vessel and sustains the ICP. Because the low pressure ICP is diffusion dominated, the plasma density and, thereby, the radial plasma ion flux density distribution at the ion optics plane, of a conventional broad ion beam source is invariably convex, i.e. highest at the center of the source and decreasing radially. This introduces non-uniformities into the ion current density distribution of the broad ion beams generated by such conventional ion sources.

Typical broad beam ion sources utilize a multi-electrode accelerator system for forming and accelerating the ions into a beam. The electrodes in this system are flat or dished multi-aperture plates, typically called grids. A conventional method of compensating for the effect on the ion beam profile of the plasma non-uniformities described above is to radially vary the transparency of the grids so as to decrease the beam current density in the center. However, this compensation method has several limitations. Variations in the transparency of the ion optics cannot compensate for variations in the plasma density profile for different ion source operating conditions (rf power, beam voltage and current, gas type and pressure), for any time dependence of these factors between system maintenance periods, or for variations in source and ion optics, either short and long term service condition changes in a given etch module because of the effect of mass- and thermal loads or module-to-module variations due to differences in ion source or grid construction. Furthermore, a concave or convex, rather than flat, beam profile is sometimes desirable for a particular process, to compensate for variations in other aspects of processing of the substrates, such as beam spreading during transport to the wafer, clamp effects at the periphery of the substrate, or variations in the thickness of the material layer being etched or the width of the etch mask features.

In addition, localized variations in the plasma radial and azimuthal density distributions are observed, which typically limit the uniformity of the IBE process. The location and shape of these variations depend on the operating conditions and thus are also not easily compensated for by grid optics transparency tuning.

What is needed, therefore, are improved ion sources for generating an energetic beam of particles, such as ions, having enhanced control over the ion current density distribution.

SUMMARY OF THE INVENTION

In accordance with one embodiment, an ion source for a plasma processing apparatus comprises a discharge chamber including a closed end, an open end, and a tubular sidewall extending between the closed and open ends. An antenna is adapted to generate a plasma from a working gas inside the discharge chamber. An electromagnet is disposed proximate to the discharge chamber. The electromagnet includes a first pole piece formed from a magnetically permeable material and a first coil. The first coil is disposed proximate to a tubular sidewall of the first pole piece. The first coil is configured to be energized to generate a magnetic field radially inside the tubular sidewall and between the closed and open ends. The first pole piece is configured to shape the magnetic field effective for changing a distribution of the plasma inside the discharge space.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
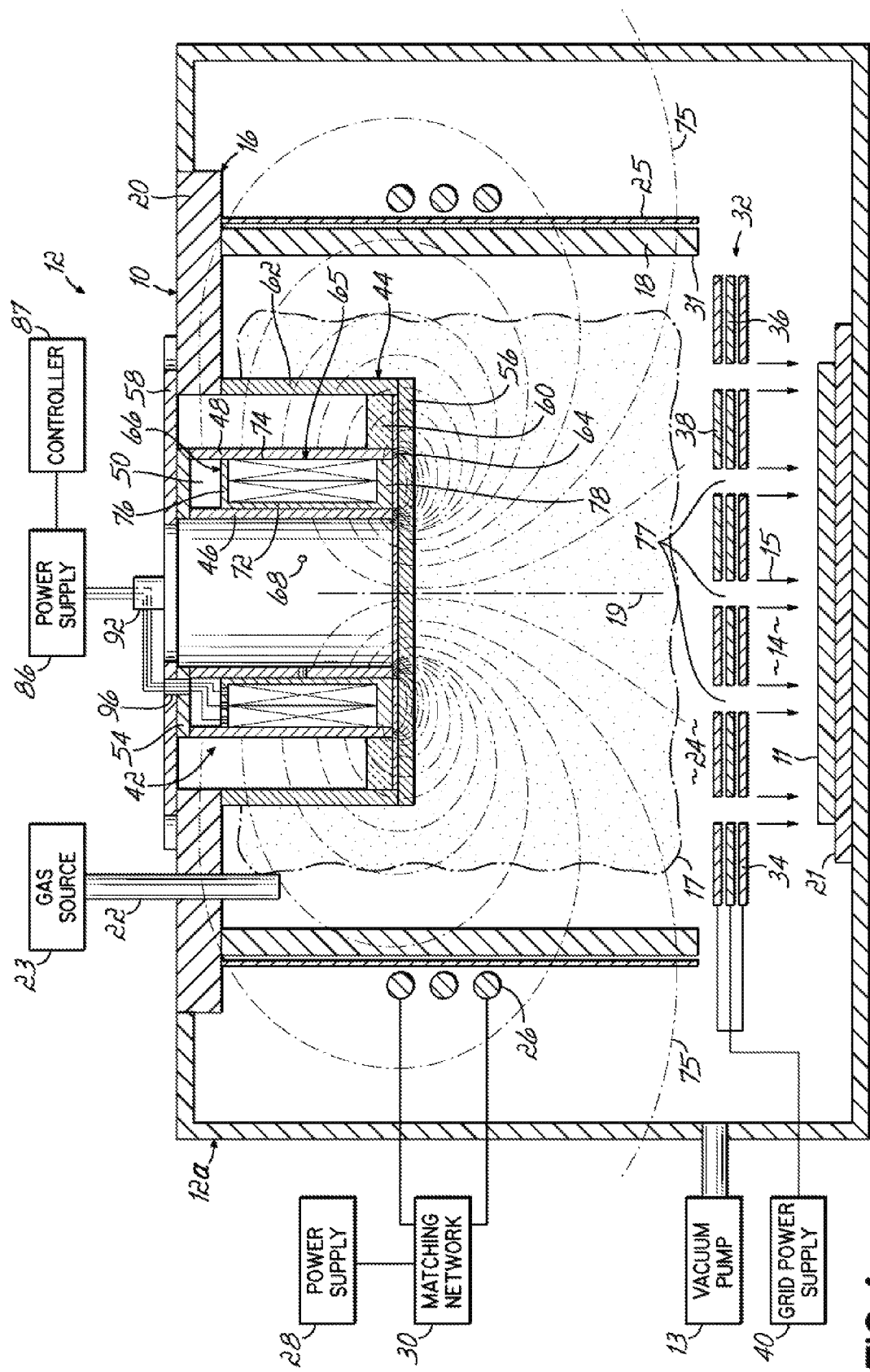
FIG. 1 is a cross-sectional view of a portion of a high vacuum processing system incorporating an ion source with an embodiment of an electromagnet assembly.
Figure 2:
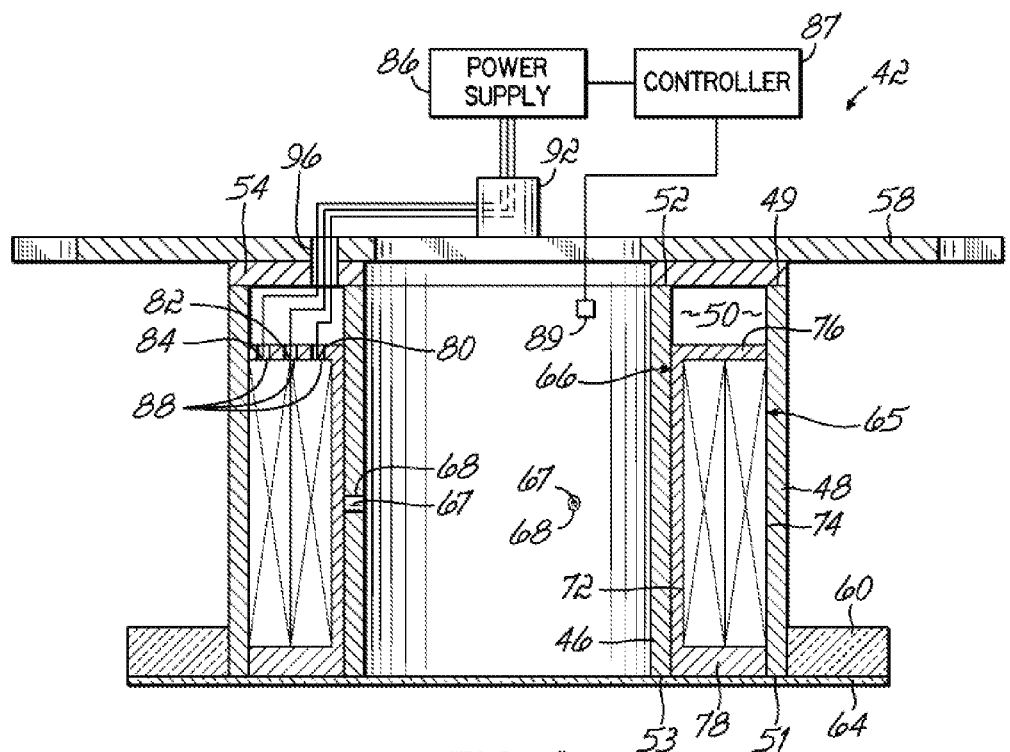
FIG. 2 is an enlarged view of an electromagnet assembly of the ion source and electromagnet assembly of FIG. 1.

With reference to FIGS. 1 and 2, an ion source 10 for use in a vacuum processing system 12 is adapted to generate an ion beam 15 of working gas ions, which is diagrammatically represented by single headed arrows 15, that is directed toward at least one substrate 11. The vacuum processing system 12 includes a process chamber 12a with a chamber wall that encloses a processing space 14 and a high vacuum pump 13 configured to communicate with the processing space 14 through the chamber wall of the process chamber 12a. The ion beam 15 may comprise working gas ions extracted from a plasma 17 generated from an ionizable working gas by the ion source 10 and directed through the process chamber 12a toward the substrate 11. Bombardment of the substrate 11 by the ion beam 15 processes the substrate 11 to achieve an intended beneficial result. Among other beneficial results, the ion beam 15 may be used to remove material from a top surface of the substrate 11 by an ion beam etching process.

The ion source 10 includes a discharge chamber 16 defined by tubular sidewall 18, which is generally centered about an azimuthal axis 19. The tubular sidewall 18 has an opening defined by an open end 31 and a back flange 20 closing the opposite end of the tubular sidewall 18. The tubular sidewall 18 is formed at least partially from a dielectric material, such as quartz or alumina. High frequency electromagnetic energy, in particular radio frequency electromagnetic energy, can penetrate through the dielectric material portion of the sidewall 18 with low losses within the material. The ion source 10 includes various high vacuum sealing members (not shown) that provide hermetic seals for vacuum isolation. A gas inlet 22, which extends through the back flange 20, communicates with a discharge space 24 enclosed inside the discharge chamber 16. The gas inlet 22 permits a regulated flow rate of the working gas to be introduced from a metered gas source 23 to the discharge space 24. A sub-atmospheric environment, which may be at a vacuum pressure typically in the range of 0.05 mTorr to 1 mTorr, is maintained in the discharge space 24 virtue of fluid communication with the evacuated process chamber 12a.

A coil antenna 26 is wrapped about a portion of the exterior of the discharge chamber 16. A power supply 28 is electrically coupled with the coil antenna 26 through an impedance matching network 30. The power supply 28 may power to the coil antenna 26 at a frequency ranging from about 500 kHz to about 15 MHz. An optional Faraday shield 25 is disposed between the coil antenna 26 and the tubular sidewall 18.

High frequency electromagnetic energy, such as radiofrequency (RF) electromagnetic energy, is transmitted from the coil antenna 26 to the working gas in the discharge space 24 for generating and sustaining the plasma 17. More specifically, an electrical current oscillates at a high frequency in the coil antenna 26, which generates a time-dependent magnetic field transmitted to the discharge space 24 through the Faraday shield 25 and subsequently through the tubular sidewall 18. The time-dependent magnetic field induces an azimuthal electric field inside the discharge space 24 having field lines concentric with the coil antenna 26. The induced azimuthal electrical field accelerates electrons inside the discharge space 24 to travel along circular trajectories. Collisions between the energetic electrons and neutral atoms of the working gas ionize the gas atoms and generate additional electrons that are accelerated in the azimuthal electrical field. This generates and sustains the plasma 17 in the discharge space 24.

A multi-aperture ion optic or grid assembly 32, which is situated at the open end 31 of the tubular sidewall 18, is used to extract the working gas ions from the plasma 17 generated in the discharge space 24 and to form the working gas ions into the ion beam 15 propagating to the substrate 11 to the process chamber 12a. The grid assembly 32 includes a plurality of grids 34, 36, 38 spanning the tubular sidewall 18 at the open end 31 of the ion source 10. When appropriately biased, the grids 34, 36, 38 substantially contain the plasma 17 within the discharge space 24 and control the extraction of the ion beam 15 from the discharge space 24. Each of the grids 34, 36, 38 is perforated by an array of apertures 77 that allow charged particles to pass through the grid assembly 32. Typically, the apertures 77 of the grids 34, 36, 38 are round and closely aligned with each other.

The substrate 11 is supported inside the processing space 14 of process chamber 12a in a spaced relationship with the grid assembly 32. A sub-atmospheric environment, which may be at a working gas pressure, typically in the range of 0.05 mTorr to 1 mTorr, is maintained in the discharge space 24 virtue of fluid or pumping communication through the grid assembly 32 and the open end 31 of the tubular sidewall 18 with the evacuated process chamber 12a.

Grid power supplies 40 are electrically coupled with the grids 34, 36, 38. In an embodiment having operational requirements for operation with a positive ion beam, the extraction or screen grid 34 may be biased with an adjustable positive electrical potential. The accelerator grid 36 may be biased with an adjustable negative electrical potential to effectively define the ion beam extraction voltage and suppress the beam plasma electrons penetrating through the grid apertures of grid 38, which is typically at a ground potential.

A cup-shaped re-entrant vessel 44 projects from the back flange 20 into the discharge space 24 toward grid assembly 32. The re-entrant vessel 44, which may be formed from a conductor such as aluminum, includes an end wall 56 and a sidewall 62 extending axially from the end wall 56 to the back flange 20. The sidewall 62 of the re-entrant vessel 44 and the tubular sidewall 18 of the discharge chamber 16 may be concentric and aligned coaxially with the azimuthal axis 19. The substrate 11 is received and held on a substrate support 21 that is disposed within the process chamber 12a such that the top surface of the substrate 11 confronts the open end 31.

With reference to FIGS. 1 and 2, the ion source 10 includes an electromagnet assembly 42 that is at least partially installed in the re-entrant vessel 44 and that includes at least tubular pole pieces 46, 48. In the representative embodiment, the pole pieces 46, 48 have the geometrical shape of a right circular cylinder and are concentrically arranged about the azimuthal axis 19. In other embodiments, the pole pieces 46, 48 may have any suitable tubular geometrical shape, including but not limited to elliptical cylinders, conical frustums, or pyramidal frustums.

In the representative embodiment, the pole piece 46 is disposed radially inside the pole piece 48 such that the outer concave surface of the pole piece 46 confronts the inner convex surface of the pole piece 48. The pole piece 46 includes opposite open ends 52, 53 separated by a height along the azimuthal axis 19 and the pole piece 48 extends between opposite open ends 49, 51 also separated by the height. The pole pieces 46, 48 are separated by an open space or gap 50.

The axial position of the electromagnet assembly 42 with respect to the grid assembly 32 and/or the lateral position with respect to the azimuthal axis 19 may be optimized to tailor the profile of the plasma density distribution and, thereby, the density distribution of the ion flux at the grids 34, 36, 38 by controlling the distribution of the electromagnetic field of the electromagnet assembly 42 within the discharge space 44. In particular, the electromagnet assembly 42 may be laterally positioned asymmetrically to the azimuthal axis 19 to compensate for any systematic asymmetry in the plasma density distribution, which may be intrinsically present absent the influence of the electromagnet assembly 42. Tailoring the ion flux density distribution permits the current density distribution of the ion beam 15 extracted from the plasma 17 to be optimized.

The open end 52 of the pole piece 46 and the open end 49 of the pole piece 48 are mounted with conventional fasteners (not shown) to a ring-shaped magnetic core element 54 of the electromagnet assembly 42. The pole piece 46, the pole piece 48, and the core element 54 are formed from a magnetically permeable material such as low carbon steel, iron, or any other suitable ferromagnetic material and are electrically grounded. In an alternative embodiment, the core element 54 may be fabricated from a nonmagnetic material.

The electromagnet assembly 42 is secured with conventional fasteners between core ring plate 54 and a nonconductive mounting plate 58, which peripherally overlaps the back flange 20. The mounting plate 58 may be secured by conventional fasteners (not shown) to the back flange 20. The electrical insulation strength of mounting plate 58 allows the core element 54 and pole pieces 46, 48 to be electrically grounded without shorting to the back flange 20, which may be permitted to electrically float with the potential of the plasma. The optimum position and dimensions of the electromagnet assembly 42 and re-entrant vessel 44 may depend on characteristics of the plasma and application, such as the required zone of uniformity, RF power, and beam parameters.

The position of the electromagnet assembly 42 may be located (e.g., centered) inside the re-entrant vessel 44 by a ring 60. Ring 60 is fabricated from an electrically insulating material for the same reasons and having the same electrical requirements as mounting plate 58. Suitable electrically insulating materials include but are not limited to a glass epoxy laminate or a phenolic resin. Ring 60 is disposed between the pole piece 48 and sidewall 62. Ring 60 has an outer diameter approximately equal to an inner diameter of the sidewall 62 of the re-entrant vessel 44 to establish a snug fit with close dimensional tolerance and an inner diameter slightly larger than the outer diameter of the second cylinder 48. Ring 60 is secured to the second cylinder 48 with conventional fasteners.

A plate 64 of an insulating material is interposed between the end wall 56 of the re-entrant vessel 44 and the pole pieces 46, 48 of the electromagnet assembly 42. The insulating material constituting plate 64 may be a polymeric fluorocarbon material such as polytetrafluoroethylene (PTFE), the homopolymer of tetrafluoroethylene commercially available from DuPont under the trade name TEFLON®.

The electromagnet assembly 42 includes a wire bobbin or spool 66 and wire coils 72, 74, which in combination with the pole pieces 46, 48 constitute an electromagnet 65. Each of the wire coils 72, 74 comprises a continuous winding of an insulated conductor that is wrapped about the wire spool 66 with a suitable solenoidal winding pattern. In specific exemplary embodiments, the number of turns in the wire coils 72, 74 may range from 300 turns to 3000 turns.

The wire spool 66, which may be formed from a polymer resin or other nonmagnetic material, is situated in the open space 50 between the pole pieces 46, 48. The height of the wire spool 66 is shorter than the height of the pole pieces 46, 48. The pole piece 46 includes holes 68 dimensioned to receive setscrews 67 that are tightened to secure the axial position of the wire spool 66 along the azimuthal axis 19. When the setscrews 67 are loosened, the axial location of the wire spool 66 can be shifted toward the end wall 56 of the re-entrant vessel 44 and in an opposite direction toward the core element 54. The wire spool 66 is depicted in FIGS. 1 and 2, for purposes of illustration only, as shifted to an axial position remote from the core element 54 and in close proximity to the end wall 56. Located at opposite ends of the wire spool 66 are radially-extending flanges 76, 78.

In an alternative embodiment, the core element 54 may be omitted from the construction of the electromagnet assembly 42 by selection of a mounting mechanism (not shown) on mounting ring 58 of appropriate mechanical strength. In another alternative embodiment, the axial position of the wire spool 66 may be adjusted in a different manner, such as pins are received in one of a row of appropriately sized openings determinative of different locations relative to the end wall 56. In yet another alternative embodiment, the axial location of the wire spool 66 may be fixed relative to the end wall 56 at an axial location so that the axial position of the wire spool 66 is a controlled variable.

In alternative embodiments, the shape of the back flange 20 may be of any practical geometry, including that of a plate or dome (either re-entrant or non-re-entrant). In such alternative embodiments, the electromagnet assembly 42 may be disposed outside the back flange 20 opposite to the grid assembly 32, within a working distance in which the amplitude of the electromagnetic field generated inside the discharge space 44 by the electromagnet assembly is significant (i.e., at least on the order of the strength of the Earth's magnetic field). In general, the exact shape of the tubular pole pieces 46 and 48 of the electromagnetic assembly 42 may be shaped in a manner to conform to the shape of the back flange 20 and/or optimize the magnetic field distribution inside the re-entrant vessel 44.

The wire coils 72, 74 of electromagnet 65 are positioned between the flanges 76, 78 and are centered in a radial direction about (i.e., coaxial with) the azimuthal axis 19. The continuous insulated conductor of the first magnetic wire coil 72 extends between a first end terminal or tap 80 and a second end terminal or tap 82. The continuous insulated conductor of the second magnetic wire coil 72 extends between a third end terminal or tap 84 on wire coil 74 and the second end tap 82, which is shared with the magnetic wire coil 72.

The wire coils 72, 74 of electromagnet 65 are electrically coupled with a power supply 86, which is electrically coupled with a controller 87. The positive and negative voltage polarity terminals of the power supply 86 may be electrically coupled with taps 80, 82 to provide a first range of operation that includes only the continuous conductor of wire coil 72, with taps 80, 84 to provide a second range of operation in which the continuous conductor of wire coils 72, 74 are connected in series, or with taps 82, 84 to provide a third range of operation that includes only the continuous conductor of wire coil 74. A switching device (not shown) may be provided in the power supply 86 to adjust the closed circuit with the wire coils 72, 74 and thereby selectively establish each of the three ranges. Holes 88 are provided in flange 76 of the wire spool 66 to provide access for conductors establishing a closed circuit between the taps 80, 82, 84 and the power supply 86. The conductors are routed through a wire way 96 defined in the core element 54 and mounting plate 58. A guidepost 92 serves as a feed for routing the conductors to the power supply 86.

In an alternative embodiment, the electromagnet assembly 42 may omit one of the two coils 72, 74 such that only a single range of operation exists. The taps of the remaining one of the coils 72, 74 are coupled in a closed circuit with the power supply 86 and energized by current from the power supply 86. Power supply 86 is a direct current (DC) power supply or, alternatively, may comprise a pulsed DC power supply or an alternating current (AC) power supply. The power supply settings are determined by the controller 87, which may be manually operated or part of an automated system controller.

The electromagnet 65 generates a magnetic field 75, which includes magnetic induction lines diagrammatically shown in FIG. 1, that has a magnetic field strength approximately proportional to the current supplied to the wire coils 72, 74. The magnetic field 75, which is azimuthally symmetrical about the azimuthal axis 19, changes the plasma density distribution in the discharge space 24, which in turn alters the ion current density uniformity of the ion beam 15. The magnetic field 75 is significantly inhomogeneous with maximum field strength in the region between the respective open ends 51, 53 of the pole pieces 46, 48, diminishing with increasing distance from the open ends 51, 53, and minimum field strength proximate to the grid 38 and the coil antenna 26. The magnetic field lines generally converge towards the azimuthal axis 19, which indicates the magnetic field strength increases in this region of the discharge space 24, and hence the magnetic field 75 may act on the plasma electrons arriving from the peripheral regions as a magnetic mirror. Such a magnetic field configuration may allow plasma density distribution modifications with minimum RF ionization efficiency reduction (i.e., the region of the discharge space 24 characterized by low field strength near the coil antenna 26) and with minimum ion optics operation distortion (i.e., the region of the discharge space 24 characterized by low field strength near the grid assembly 32).

The magnetic field 75 directly affects the plasma density distribution in the ion source 10 and, therefore, the plasma ion flux distribution directed from the plasma 17 to the grid plane defined by the grid assembly 42. In this manner, the magnetic field 75 generated by the electromagnet assembly 42 influences the characteristics of the ion beam etch profile on the substrate 11. If the grid spacing and the size and distribution of the apertures 77 in the grid assembly 32 is relatively uniform, a convex ion flux distribution in the ion source 10 will also result in a convex ion beam profile between the ion source 10 and substrate 11. However, the beam profile may tend to be more uniform due to divergence and overlap of individual beamlets. The convex profile has a maximum at the center of the source 10 (i.e., near azimuthal axis 19) and decreases in magnitude with increasing radius from the center of the source 10. At a normal angle of incidence and assuming the surface of the substrate 11 is relatively smooth and flat, the beam profile will produce an etch profile in the substrate 11 that is similar to the ion beam profile.

Although not wishing to be limited by theory, it is believed that the volumetric inhomogeneous magnetic field 75 introduced by the electromagnet assembly 42 has two distinct effects on the radial distribution of the ion flux corresponding to the two different trends in the effect on the etch profile. At low magnetic field strengths (i.e., low electromagnet currents in coils of the electromagnet), the magnetic field 75 is believed to magnetize the plasma electrons primarily near azimuthal axis 19. This is believed to confine the plasma electrons to long helical orbits around the magnetic induction lines and, hence, increases the working gas ionization efficiency in this region. In this mode of ion source operation, the radial distribution of the plasma ion flux arriving to the grid plane of the grid assembly 32 becomes more convex. At higher magnetic field strengths (i.e., higher currents in coils 72, 74), some of the hot plasma electrons arriving from the coil vicinity are believed to be reflected from the plasma generator mirroring magnetic field regions, such as near azimuthal axis 19 and open ends 51, 53 (i.e., poles), toward the periphery of the discharge space 24. As a result, the working gas ionization efficiency is believed to be reduced in the plasma generator center (i.e., near azimuthal axis 19) and to increase at the periphery, and the radial distribution of the plasma ion flux arriving to the grids 34, 36, 38 may become less convex in comparison with the original magnetic field free distribution.

The useful operating range of the electromagnet assembly 42 may depend on other aspects of the design of the ion source 10, as well as upon the specific etch process conditions and the desired etch profile. The grid assembly 32, which supplied the ion optics in the representative embodiment, may be designed with variable transparency to optimally utilize the electromagnetic tuning capability. For example, the adjustable transparency for the grid assembly 32 can be achieved by varying the density of the passageways 77 in the grid assembly 32 and/or varying the size of the passageways 77 across the grid assembly 32. Manipulating either of these variables pertaining to the passageways 77 may adjust the distribution of ion current emitted across the width of the grid assembly 32 and, ultimately, the uniformity of the etch rate at the substrate 11.

The magnetic field 75 of the magnet assembly 42 may be varied during substrate processing or from run to run to vary the ion beam current density distribution for maintaining the desirable substrate etch rate distribution. This feature may be carried out by monitoring the ion beam current density distribution or substrate etch rate distribution, either in-situ or ex-situ, and tuning or varying the magnetic field 75 so as to achieve a targeted beam current density distribution and/or etch rate distribution at the substrate 11. To that end, the electrical current from the power supply 86 to coils 72, 74 may be selectively variable for selectively controlling the field strength of the electromagnet assembly 42 and further selectively modifying plasma density distribution in the discharge space 24.

The substrate processing equipment may include in addition to the processing system 12 for conducting the ion beam etch process, an automatic electromagnet magnet power supply controller, and etch profile measurement system (whether in-situ or ex-situ) such that the entire operation may be carried out without need for any action by the user.

If the hysteresis effect due to residual or remnant magnetization of the soft magnetic pieces represented by the pole pieces 46, 48 in this construction may not be negligible compared to the desired range of the source electromagnetic field operation, the repeatability of the net magnetic field strength, and thus the etch profile, can be negatively affected. Although this effect can be minimized by careful specification of the material of the components, provision can also be made to reverse the current in wire coils 72, 74 between settings to demagnetize the magnet and cancel the remnant magnetic field.

In one embodiment, a magnetic field probe or sensor 89 (FIG. 2) may be placed inside of the re-entrant vessel 44 adjacent to the cylinder 46, for example, in an orientation to measure the magnetic field strength perpendicular to one of the azimuthal axis 19. The sensor 89 may be repositioned within the re-entrant vessel 44 as long as the measured value is at least a large fraction of that reading (e.g., greater than about 50%) and is roughly proportional to that reading over the desired range of magnet currents. When changing magnet current settings, the current to the coils 72,74 is first switched off and the remnant field strength magnitude is measured on the magnetic field sensor 89.

If the remnant magnetic field strength exceeds an acceptable threshold based upon experimental results or historical performance, a small reverse current is applied to coils 72,74 with the objective of reducing the remnant magnetic field strength. The small magnet current in coils 72,74 is a fraction of the magnitude and opposite in polarity to that which was last applied. The magnet current to the electromagnet 42 is then switched off and the remnant field magnitude is re-measured using magnetic field sensor 89. If the remnant magnetic field strength magnitude remains above the acceptable threshold, the correction process is repeated by measuring adjusting the reverse current until the remnant field strength magnitude is reduced below the acceptable threshold. If the correction process results in a remnant field of opposite polarity because of overcompensation, the correction process is reversed. If the magnet current is to be adjusted to a higher magnitude of the same polarity, there is no impact from the hysteresis effect and the demagnetization operation supplied by the correction process may not be necessary.

The magnetic field sensor 89 may also be useful to provide closed loop control of the magnetic field strength for improved process control. However, if no magnetic field sensor 89 is incorporated into the ion source 10, the demagnetization process may still be applied. In this instance, a fixed reverse magnet current strength magnitude may be applied for demagnetization, the value of which is determined by, for example, experiment, and typically limited to a range of about 10% to about 30% of the maximum current employed during the previous process.

Figure 2A:
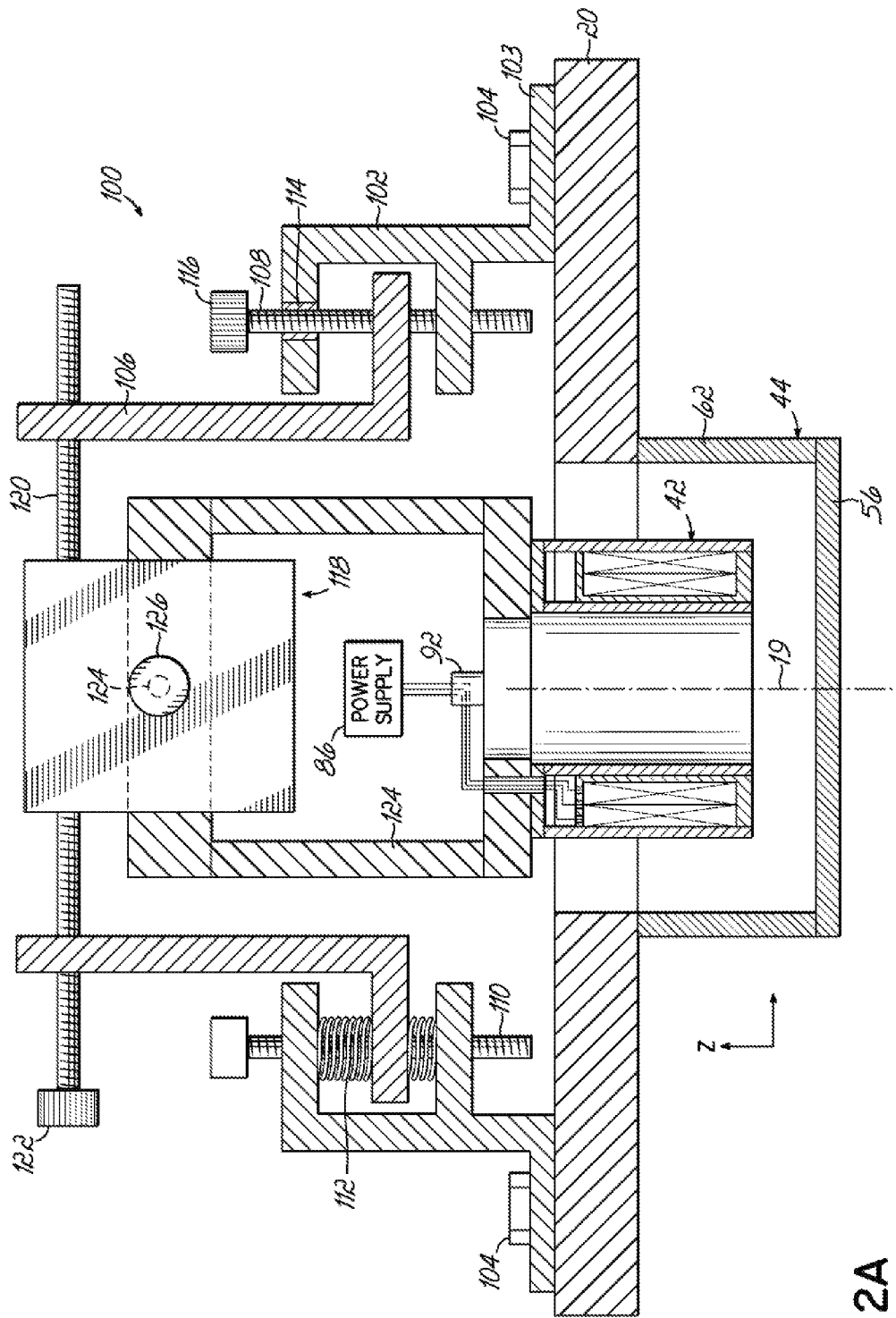
FIG. 2A is an enlarged view similar to FIG. 2 of an ion source and electromagnet assembly, along with a portion of the processing system, in accordance with an alternative embodiment.

With reference to FIG. 2A and in accordance with an alternative embodiment of the invention, the ion source 10 may further include a single or multi-stage positioner, generally indicated by reference numeral 100, configured to allow the electromagnet assembly 42 to travel along the axial direction 19, as limited by the end wall 56, or to travel laterally, as limited by the diameter of the tubular sidewall 18 of re-entrant vessel 44. The positioner 100 provides adjustability of the position of the electromagnetic assembly 42 with respect to the plasma volume in discharge space 24.

The positioner 100, which mounts the electromagnet assembly 42 to the back flange 20, may include a series of brackets and adjusting mechanisms that permit independent adjustment of the X,Y,Z position of the electromagnet assembly 42 with respect to the source 10 and, in this embodiment, the re-entrant vessel 44. Specifically, the positioner 100 includes a bracket 102, which may be generally cylindrical, having a flange 103 that is mounted to the back flange 20 by a plurality of bolts 104 equally spaced apart on a bolt circle. Another bracket 106 is supported on the bracket 102 by at least one threaded rod 108 and at least one additional support rod 110, which incorporates compliant but structurally supportive spacers 112, such as springs. Where the threaded rod 108 communicates with bracket 102, the threaded rod 108 is supported by a rotary mechanism 114, such as a ball bearing assembly. This rotatable support arrangement permits the location of bracket 102 to be positioned in parallel with the azimuthal axis 19 (defining a first positioning axis "Z") by rotating the rod 108 using a thumbscrew 116.

Mounted on bracket 106 is another bracket 118, whose position is adjustable in a lateral direction perpendicular to the axis via threaded rod 120 using a thumbscrew 122 (defining a second positioning axis "x" not aligned with the first positioning axis "z"). Another bracket 124 is mounted on bracket 118 via a threaded rod (not shown), such that the position of the bracket 124 is adjustable in a direction perpendicular to the two other axes via a thumbscrew 126 (defining a third positioning axis 'y' not aligned with the first positioning axis "z" or the second positioning axis "x"). The electromagnetic assembly 42 is mounted to bracket 126.

The (x,y,z) positioning axes may comprise a Cartesian coordinate system with mutually orthogonal axes that supplies at least three degrees of freedom for positioning the electromagnet assembly 42 relative to the back flange 20. However, it is understood that various other frames of reference may be employed for describing and implementing the motion directions of the brackets 102, 106, 118, 122 in a different frame of reference for positioning the electromagnet assembly 42 relative to the back flange 20.

The positioner 100 may have other mechanical constructions understood by a person having ordinary skill in the art. In an alternative embodiment, the positioner 100 may be automated by, for example, replacing the manually-manipulated thumbscrews 110, 114, 118 with stepper motors electrically coupled with the controller 87. The stepper motors would be operated by electrical signals derived from programmed instructions from, for example, a software algorithm resident on the controller 87.

Figure 3:
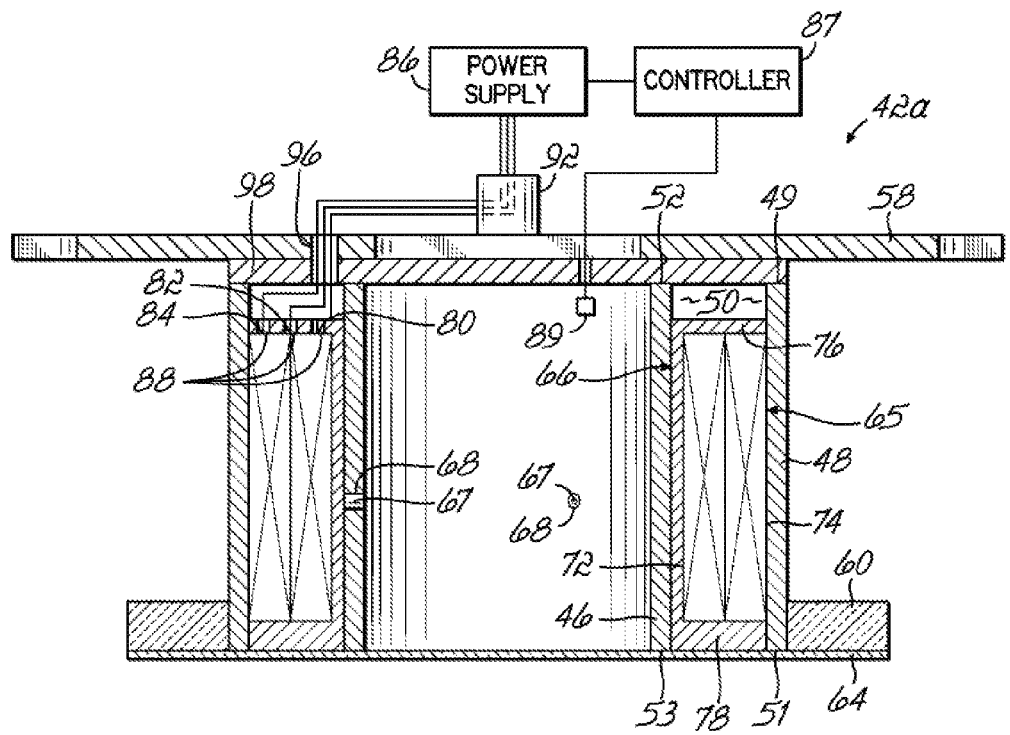
FIG. 3 is an enlarged view similar to FIG. 2 of an electromagnet assembly in accordance with an alternative embodiment.

With reference to FIG. 3 in which like reference numerals refer to like features in FIG. 2 and in accordance with an alternative embodiment of the invention, a electromagnet assembly 42a for electromagnet 65 includes a solid disk-shaped core element 98 coupled with the pole pieces 46, 48 and unbroken but for the wire way 96. Core element 98, which replaces core element 54, bridges the gap between the open end 49 of pole piece 48 and the open end 52 of the pole piece 46. The core element 98 also closes the bore radially inside the open end 52 of the pole piece 46. The core element 98 is formed from magnetically permeable material and is conventionally fastened to the mounting plate 58. A1,2,3,4

Figure 4:
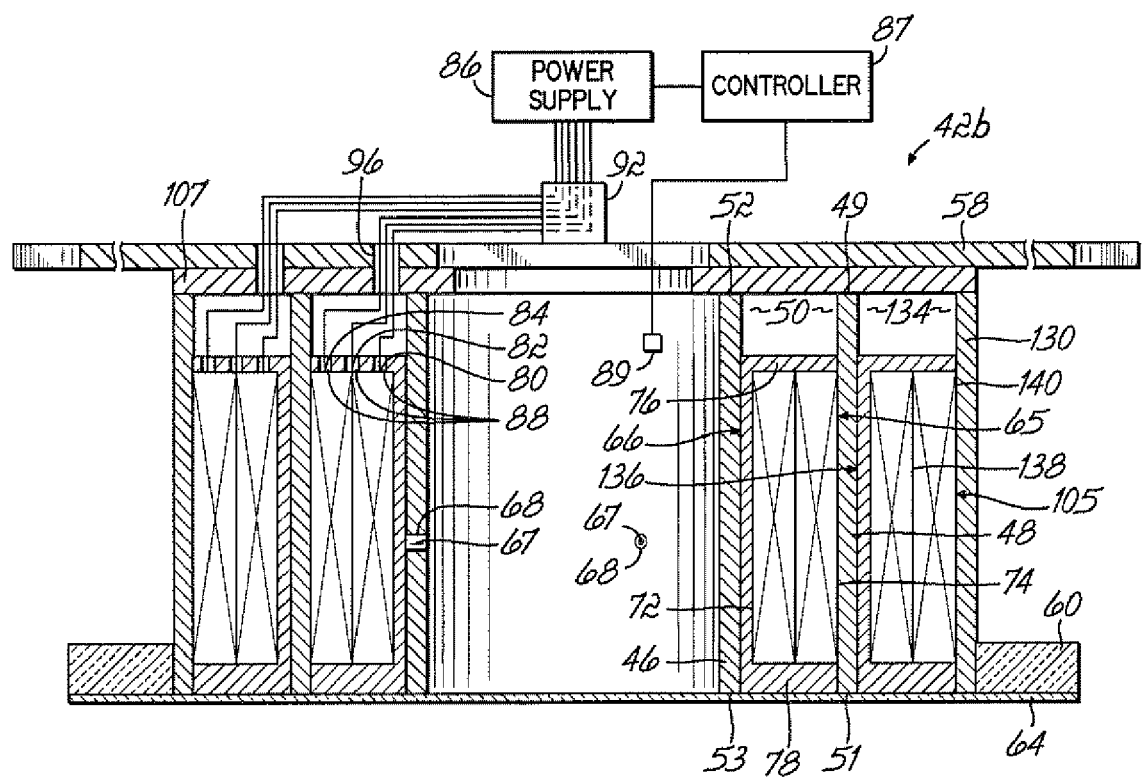
FIG. 4 is an enlarged view similar to FIGS. 2 and 3 of an electromagnet assembly in accordance with an alternative embodiment.

With reference to FIG. 4 in which like reference numerals refer to like features in FIG. 2 and in accordance with an alternative embodiment of the invention, an electromagnet 105 includes an electromagnet assembly 42b, which is similar to electromagnet assembly 42a, with a pole piece 130. The pole piece 130 is concentrically arranged with the pole pieces 46, 48 such that the pole piece 48 is disposed radially between pole pieces 46 and 130. The pole pieces 46, 48, 130 extend axially from an annular core element 107. Pole piece 130 and the core element 107 are also formed from a magnetically permeable material such as low carbon steel, iron, or any other suitable material.

Disposed in an open space 134 between the second and third pole pieces 48, 130 are additional wire coils 138 and 140 and a wire bobbin or spool 136, which along with coils 72, 74 and spool 66 collectively define the electromagnet 105. The wire spool 136 is substantially identical to wire spool 66, and the pair of coils 138, 140 is substantially identical to coils 72, 74.

The coils 138, 140 are disposed at a greater radius relative to azimuthal axis 19 (FIG. 1) than coils 72, 74 of electromagnet 42. Coils 138, 140 may be energized independent of coils 72, 74, such that the impact of the magnetic field 75 on plasma 17 (FIG. 1) can be distributed over a larger or smaller diameter relative to azimuthal axis 19. The radial distribution may be contingent upon the etch requirement. The independent field generation can be provided by energizing only coils 72, 74, by energizing only coils 138, 140, by switching between one set of coils 72,74 and the other set of coils 138, 140, or energizing all coils 72, 74, 138, 140 simultaneously while utilizing independent magnet current settings.

In an alternative embodiment, the electromagnet assembly 42b may omit one of the two coils 72, 74 and/or one of the two coils 138, 140 such that only a single range of operation exists for each coil set. In this alternative embodiment, two taps of the remaining one of the coils 72, 74 are coupled in a closed circuit with the power supply 86 and energized by current from the power supply 86. Similarly, two taps of the remaining one of the coils 138, 140 are coupled in a closed circuit with the power supply 86 and energized by current from the power supply 86.

Figure 5:
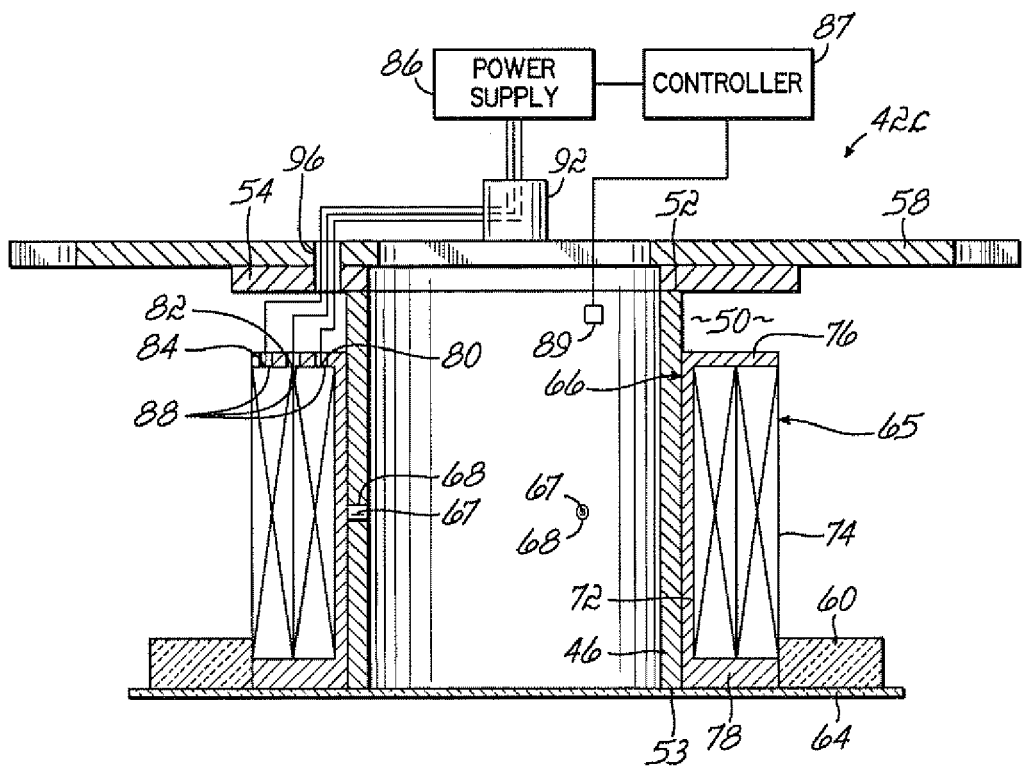
FIG. 5 is an enlarged view similar to FIGS. 2-4 of an electromagnet assembly in accordance with an alternative embodiment.

With reference to FIG. 5 in which like reference numerals refer to like features in FIG. 2 and in accordance with an alternative embodiment of the invention, an electromagnet assembly 42c omits the pole piece 48 so that the wire coils 72, 74 are disposed radially outside the pole piece 46. As a result, the wire coils 72, 74 are radially flanked only on their inner diameter (relative to the azimuthal axis 19 (FIG. 1) by magnetically permeable material that shapes and concentrates the magnetic field emitted from the energized wire coils 72, 74.

Figure 6:
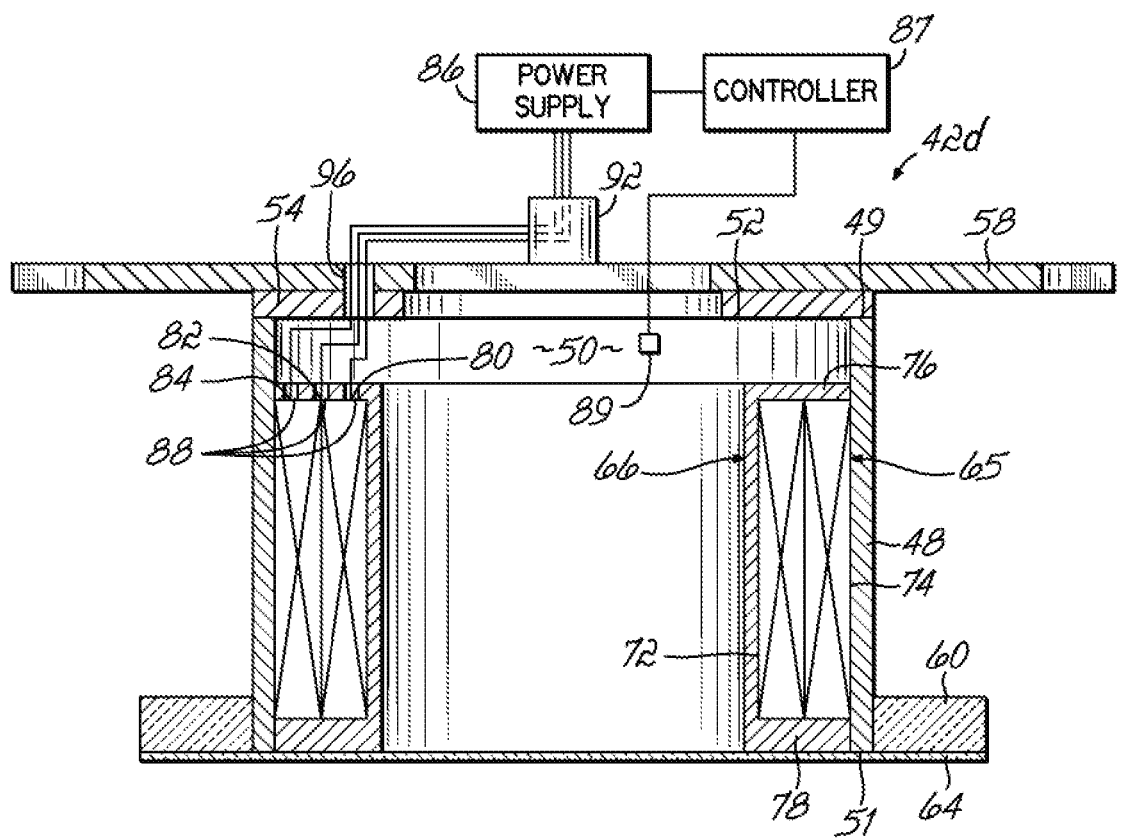
FIG. 6 is an enlarged view similar to FIGS. 2-5 of an electromagnet assembly in accordance with an alternative embodiment.

With reference to FIG. 6 in which like reference numerals refer to like features in FIG. 2 and in accordance with an alternative embodiment of the invention, an electromagnet assembly 42d omits the pole piece 46 so that the wire coils 72, 74 are disposed radially inside the pole piece 48. As a result, the wire coils 72, 74 are radially flanked only on their outer diameter (relative to the azimuthal axis 19) by magnetically permeable material effective to shape, direct, and concentrate the magnetic field emitted from the energized wire coils 72, 74.

Further details and embodiments of the invention will be described in the following example.

EXAMPLE 1

An ion source having an electromagnet assembly, otherwise substantially identical to electromagnet assembly 42b (FIG. 4) but with each of the inner and outer electromagnet coils 65, 105 including a single coil of 970 turns, was equipped with an ammeter between the coil of the radially innermost electromagnet and power supply for purposes of measuring the current supplied to the coil of this electromagnet. The coil 105 of the radially outermost electromagnet was disconnected from the power supply so that only the innermost electromagnet was energized. An electrical probe was inserted into the beam and situated in the substrate plane perpendicular to the beam incidence direction. The probe, being charged under the substrate processing, allowed measuring the voltage, which was considered as a measure of the broad ion beam neutralization.

A 1200 V, 650 mA beam of positively charged ions was extracted from an argon gas plasma. While propagating toward the substrate, the ion beam was neutralized utilizing a plasma bridge neutralizer. A series of silicon oxide coated silicon wafers were etched at normal incidence at different ion source electromagnet current settings, $I_{mag}$. The electromagnet current settings, $I_{mag}$, was systematically varied in 0.1 ampere (A) increments. The ion beam from the ion source was directed at normal incidence to a statically held substrate to etch a portion of the silicon oxide layer. The etch rate at different locations on the substrate was calculated as the ratio of the measured etch depth (change in the oxide layer thickness) to etch time. The etch rate, which is indicated in Table 1, represents the average etch rate normalized to the average etch rate with a zero magnet coil current. The change in oxide layer thickness was determined by pre- and post-etch optical spectrophotometry measurement. The RF power and probe voltage were measured for each value of the magnet current, $I_{mag}$ and normalized to the corresponding values at zero magnet coil current. The probe voltage is representative of the level of neutralization of the broad ion beam.

TABLE 1

| $I_{mag}$ | Uniformity (3 σ/Avg) | Relative Etch Rate | Relative RF Power | Relative Probe Voltage |
|---|---|---|---|---|
| 0 | 2.19% | 1.00 | 1.00 | 1.00 |
| 0.1 A | 3.13% | 1.00 | 1.01 | 1.03 |
| 0.2 A | 3.32% | 1.01 | 1.03 | 1.04 |
| 0.3 A | 5.85% | 1.08 | 1.07 | 1.09 |
| 0.4 A | 6.11% | 1.09 | 1.06 | 1.04 |
| 0.5 A | 4.83% | 1.07 | 1.06 | 1.04 |
| 0.6 A | 4.57% | 1.08 | 1.09 | 1.09 |
| 0.7 A | 4.25% | 1.07 | 1.12 | 1.09 |
| 0.8 A | 3.68% | 1.06 | 1.13 | 1.10 |
| 0.9 A | 3.21% | 1.05 | 1.16 | 1.13 |
| 1 A | 3.70% | 1.05 | 1.17 | 1.10 |
| 1.2 A | 1.56% | 1.00 | 1.18 | 1.12 |
| 1.3 A | 1.30% | 1.00 | 1.18 | 1.19 |
| 1.4 A | 1.30% | 0.98 | 1.19 | 1.17 |

As indicated in Table 1, one metric for evaluating the etch uniformity was the "three sigma" (three times the standard deviation from the mean or average value divided by the mean) variation in the etch rate, expressed as a percentage. As apparent from the tabulated data, the uniformity of the etch rate worsens as the magnet current is raised from 0 A to 0.4 A. Above 0.4 A, the uniformity progressively improves as the magnetic field flattens the etch profile. As apparent from the tabulated data, the etch uniformity at magnet currents of 1.2 A, 1.3 A, and 1.4 A is improved in comparison with the etch uniformity at an electromagnet current of 0 A. The high degree of etch uniformity that can be achieved by this method (less than 3% three sigma) on statically held substrates indicates that when electromagnet assembly is tuned, the introduction of an external magnetic field via the electromagnet of the invention smoothes out local variations in the plasma density.

As is apparent from Table 1, the measured etch rate is weakly dependent on the electromagnet current. There is a slight effect, which can be compensated, if required, e.g. by appropriate adjustment of the etch time. This effect may be also usefully employed to tune the etch rate of the ion source rather than the etch profile, for example to match the etch rate in one module with that in another, although the practical use of such a method would depend on the sensitivity of the process to the resulting change in the etch profile. The presence of the magnetic field from the magnet assembly increases the RF power with increasing field strength (i.e., increasing electromagnet current). However, the observed increase in the RF power can be tolerated without a significant reduction in source efficiency over the entire range of electromagnet currents.

EXAMPLE 2

As evidence that the operation of the electromagnet under controlled conditions does not degrade the ion beam directionality, the "local divergence angle" of the angular distribution of the ions was evaluated for optimum electromagnet current settings at different positions in the beam and compared with equivalent results obtained without the electromagnet for the same process parameters. The "local divergence angle" was determined by etching a substrate beneath a masking aperture and measuring the size of the etch spot, essentially as described by J. R. Kahn, et al, J. Vac. Sci. Technol. A14(4), July/August 1996, p. 2106-2112 (ref. FIG. 1), except that a silicon dioxide coated silicon wafer was used as the substrate and a nanospectrophometric measurement apparatus (Nanometrics Nanospec™ 8000) capable of high resolution etch depth and lateral position measurement was used to determine the etch depth profile. The disclosure of this publication is hereby incorporated by reference herein in its entirety. The substrate was etched using the ion source of Example 1 operating at a magnet current of 1.3 A.

As shown in Table 2, the divergence angle was evaluated at two different positions on the etched silicon dioxide layer, both at normal incidence to the beam and downstream of the grid plane by about 9 inches. One position is at radius R=0 on the center axis of the beam, and the second position is at radius R=2.5", which is offset from the center of the beam by 2.5 inches. The estimated error of the divergence angle measurements is about ±0.5°. As shown in Table 2, there is no evidence of significant degradation of the beam directionality arising from electromagnet operation for the chosen operating conditions.

TABLE 2

| Beam Voltage | Beam Current | Relative Local Divergence Angle With electromagnet (optimized magnet current) | |
|---|---|---|---|
| Volts | mA | R = 0 (center) | R = 2.5" |
| 100 | 180 | 0.95 | 0.95 |
| 100 | 270 | 1.05 | 1.00 |
| 1200 | 650 | 0.93 | 1.00 |

EXAMPLE 3

Figure 7:
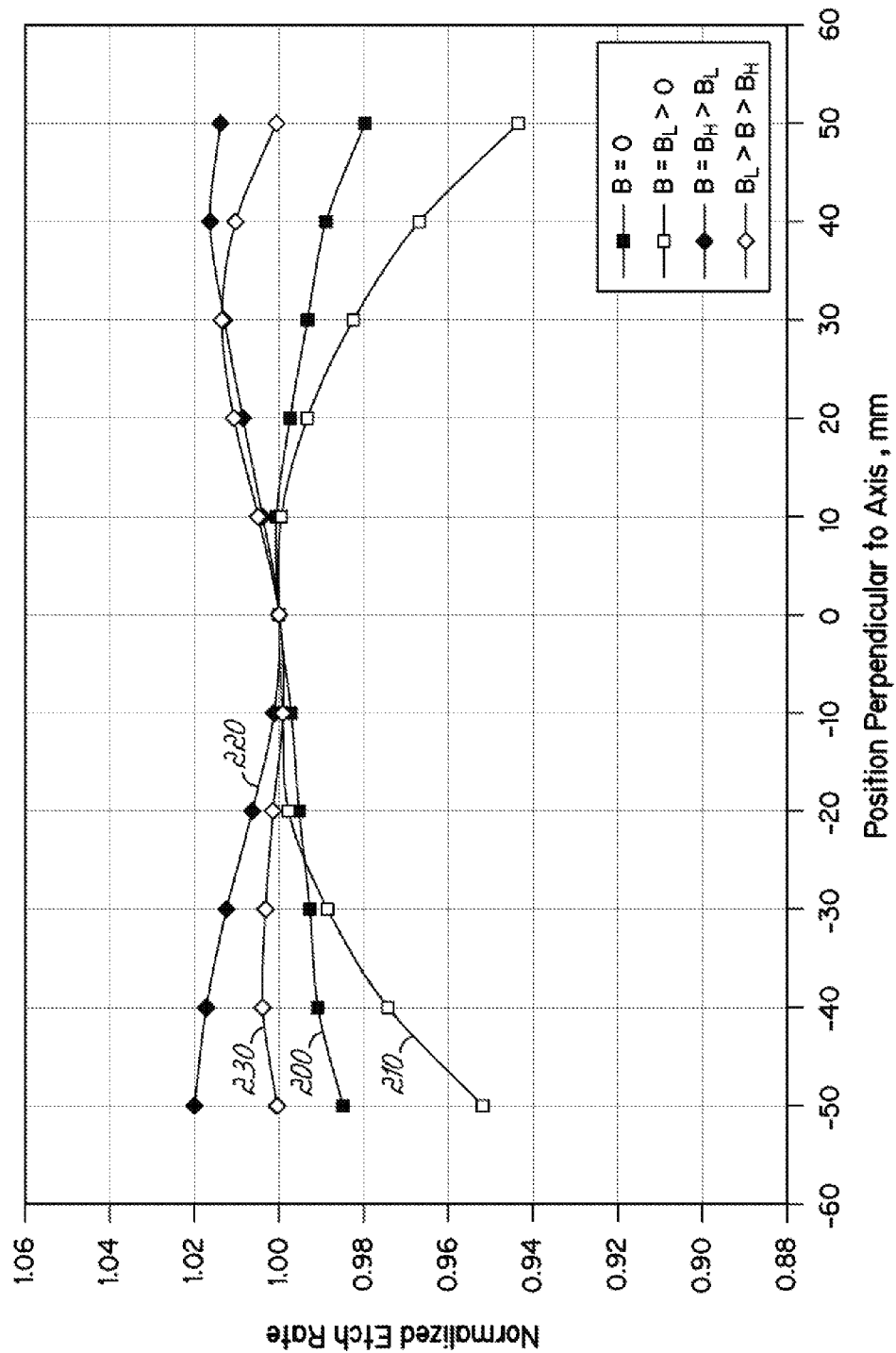
FIG. 7 is a diagrammatic graphical view illustrating the effect of the electromagnetic field generated by the ion source of FIGS. 1 and 2 on the ion beam etch profile.

A series of etch profiles, which have been normalized for presentation, were generated using the ion source of Example 1 and are shown in FIG. 7. With no current applied to the coils of the electromagnet, the plasma density distribution and the distribution of ion flux are characterized by a convex profile, which is reflected in the etch profile of curve 200. At a relatively low field strength, $B_L$, the etch profile increases in convexity with increasing field strengthen, as reflected in the etch profile of curve 210. At a relatively high field strength, $B_H$, the etch profile changes shape to become more concave with increasing field strength. Eventually, the profile itself changes to concave, as reflected in the etch profile of curve 220. At a magnetic field strength, B, between the relatively low field strength, $B_L$, and relatively high field strength, $B_H$, the etch profile will be essentially flat, i.e. not convex or concave, as reflected in the etch profile of curve 230. This behavior allows the overall shape of the etch profile to be tailored to a desired shape, and in particular is very favorable to being able to produce very uniform etching characteristics.

References herein to terms such as "vertical", "horizontal", "upper", lower", etc. are made by way of example, and not by way of limitation, to establish a frame of reference. It is understood various other frames of reference may be employed without departing from the spirit and scope of the invention. As is well known, ion sources may be oriented in substantially any orientation, so use of these directional words should not be used to imply any particular absolute directions for an apparatus consistent with the invention.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. An ion source for a plasma processing apparatus, the ion source comprising:
   a discharge chamber with a discharge space adapted to contain a working gas;
   an antenna adapted to generate a plasma from the working gas inside said discharge space; and
   an electromagnet disposed proximate to said discharge chamber, said electromagnet including a first pole piece formed from a magnetically permeable material and a first coil, said first pole piece including a tubular sidewall and said first coil located proximate to said tubular sidewall of said first pole piece, said first coil configured to be energized to generate a magnetic field in said discharge space, and said first pole piece configured to shape the magnetic field effective for changing a distribution of the plasma inside said discharge space.

2. The ion source of claim 1 wherein said first coil is arranged with a radially spaced relationship relative to said tubular sidewall of said first pole piece.

3. The ion source of claim 1 wherein said electromagnet further comprises a second pole piece formed from said magnetically permeable material, said second pole piece having a tubular sidewall, and said first coil is arranged radially between said tubular sidewall of said first pole piece and said tubular sidewall of said second pole piece.

4. The ion source of claim 3 wherein said first coil is movable within said first annular space for varying an axial position of said first coil relative to said grid assembly.

5. The ion source of claim 3 wherein said electromagnet further comprises a core element formed from said magnetically permeable material, said core element connecting said tubular sidewall of said first piece and said tubular sidewall of said second pole piece.

6. The ion source of claim 3 wherein said first and second pole pieces are coaxially arranged.

7. The ion source of claim 3 wherein said electromagnet further comprises a third pole piece formed from said magnetically permeable material, and a second coil.

8. The ion source of claim 7 wherein said third pole piece has a tubular sidewall, and said second coil is arranged radially between said tubular sidewall of said second pole piece and said tubular sidewall of said third pole piece.

9. The ion source of claim 8 further comprising:
   a core element formed from said magnetically permeable material, said core element connecting said tubular sidewall of said first pole piece and said tubular sidewall of said second pole piece, said core element connecting said tubular sidewall of said second pole piece and said tubular sidewall of said third pole piece.

10. The ion source of claim 1 wherein said first coil is movable for varying a position of said coil relative to said first pole piece.

11. The ion source of claim 1 wherein said electromagnet further includes a second coil, said first coil including a first tap, said second coil including a second tap, said first and second coils coupled in series at a third tap intermediate between said first and second taps.

12. The ion source of claim 11 further comprising:
a power supply including a first terminal of a first polarity coupled with the first tap and a second terminal of a second polarity adapted to be selectively coupled with either said second tap or said third tap.

13. The ion source of claim 1 further comprising:
a positioner configured to adjust a position of said electromagnet relative to said discharge space.

14. The ion source of claim 1 wherein said discharge chamber comprises a closed end, an open end, and a cup-shaped re-entrant vessel having a tubular sidewall projecting into said discharge space from said closed end, and said electromagnet is at least partially disposed in said re-entrant vessel.

15. The ion source of claim 14 further comprising:
at least one grid proximate to said open end of said tubular sidewall of said re-entrant vessel, said at least one grid adapted to extract ions from the plasma in said discharge space.

16. The ion source of claim 15 wherein said tubular sidewall of said re-entrant vessel projects from said closed end of said discharge chamber toward said grid assembly.

17. The ion source of claim 15 wherein said grid assembly includes apertures arranged and sized to cooperate with a distribution of the plasma inside said discharge space such that an ion beam extracted from the plasma through said apertures in said grid assembly has an ion current that is substantially spatially uniform.

18. The ion source of claim 14 further comprising:
a positioner configured to adjust a position of said electromagnet within said re-entrant vessel relative to said tubular sidewall of said re-entrant vessel.

19. The ion source of claim 18 wherein said positioner is configured to adjust the position of said electromagnet laterally relative to said tubular sidewall of said re-entrant vessel.

20. The ion source of claim 18 wherein said positioner is configured to adjust the position of said electromagnet axially relative to said open end of said re-entrant vessel.

21. The ion source of claim 14 wherein said first pole piece is disposed radially between said first coil and said tubular sidewall of said re-entrant vessel.

22. The ion source of claim 14 wherein said first coil is disposed between said first pole piece and said tubular sidewall of said re-entrant vessel.

23. The ion source of claim 1 wherein said discharge chamber comprises an opening, and further comprising:
at least one grid proximate to said opening of said discharge chamber, said at least one grid adapted to extract ions from the plasma inside said discharge space through said opening in said discharge chamber.

24. An ion source for a plasma processing apparatus, the ion source comprising:
a discharge chamber including a first end, a second end, a discharge space between said first and second ends, and an opening in said second end, said discharge space adapted to contain a working gas;
an antenna adapted to generate a plasma from the working gas inside said discharge space;
an electromagnet proximate to said first end of said discharge chamber, said electromagnet including a coil configured to be energized to generate a magnetic field in said discharge space; and
at least one grid adapted to extract ions from the plasma in said discharge space through said opening in said discharge chamber.

25. The ion source of claim 24 wherein said at least one grid includes a plurality of apertures through which the ions are extracted from the plasma.

26. The ion source of claim 24 wherein said at least one grid comprises a plurality of grids adapted to be electrically biased relative to each other to extract the ions from the plasma in said discharge space.

27. The ion source of claim 24 wherein said antenna is disposed externally to the discharge chamber.

28. An ion source for a plasma processing apparatus, the ion source comprising:
a discharge chamber with a discharge space adapted to contain a working gas, said discharge chamber including an opening;
an antenna disposed externally to the plasma vessel and adapted to generate a plasma from the working gas inside said discharge space;
an electromagnet disposed proximate to said discharge chamber, said electromagnet a coil configured to be energized to generate a magnetic field in said discharge space; and
at least one grid adapted to extract ions from the plasma in the discharge space through said opening in said discharge chamber.

29. The ion source of claim 28 wherein said at least one grid includes a plurality of apertures through which the ions are extracted from the plasma.

30. The ion source of claim 28 wherein said at least one grid comprises a plurality of grids adapted to be electrically biased relative to each other to extract the ions from the plasma in said discharge space.

31. A method of operating an ion source that includes an electromagnet having a coil and a pole piece of a magnetically permeable material disposed adjacent to the coil, the method comprising:
energizing the coil of the electromagnet with a first current effective to generate a first magnetic field defined by the pole piece configuration and material;
generating a first plasma with the density distribution in the ion source that is shaped by the first magnetic field;
energizing the coil of the electromagnet with a second current of an opposite polarity to the first current and effective to generate a second magnetic field opposing a residual magnetic field from the pole piece arising from the magnetic material hysteresis;
energizing the coil of the electromagnet with a third current effective to generate a third magnetic field defined by the pole piece and lower in field strength than the first magnetic field; and
generating a second plasma in the ion source that is shaped in the density distribution by the third magnetic field.

32. The method of claim 31 further comprising:
etching a first substrate with a first ion beam extracted from the plasma with the first density distribution; and
etching a second substrate with a second ion beam extracted from the second plasma.

33. The method of claim 31 wherein energizing the coil of the electromagnet with the second current further comprises:
supplying the second current to the coil such that a field strength of the second magnetic field is about 10 percent to about 30 percent of the field strength of the first magnetic field.

34. The method of claim 31 further comprising:
measuring the field strength of the residual magnetic field; and
setting the second current by raising the second current until the measured field strength is approximately zero.

* * * * *

UNITED STATES PATENT AND TRADEMARK OFFICE
CERTIFICATE OF CORRECTION

| | | |
|---|---|---|
| PATENT NO. | : 7,557,362 B2 | Page 1 of 1 |
| APPLICATION NO. | : 11/678979 | |
| DATED | : July 7, 2009 | |
| INVENTOR(S) | : Rustam Yevtukhov et al. | |

It is certified that error appears in the above-identified patent and that said Letters Patent is hereby corrected as shown below:

In the Specification

In column 2:
line 7, change "rf" to --RF--.

In column 4:
line 33, before "virtue", insert --by--.

In column 7:
line 51, change "is" to --are--.

In column 9:
line 4, after "to", delete "one of".
line 24, after "measuring", insert --and--.

In column 10:
line 12, change """ to --"--.
line 44, after "58.", delete "A1, 2, 3, 4".

In column 11:
line 25, before "relative", delete "(".
line 64, change "was" to --were--.

In column 13:
line 51, change "strengthen" to --strength--.
line 64, before "lower"", insert --"--.

Signed and Sealed this
Eighteenth Day of November, 2014

Michelle K. Lee
*Deputy Director of the United States Patent and Trademark Office*